(12) United States Patent
Okazaki et al.

(10) Patent No.: US 7,339,309 B2
(45) Date of Patent: Mar. 4, 2008

(54) SURFACE MOUNT CRYSTAL OSCILLATOR

(75) Inventors: Masayoshi Okazaki, Saitama (JP); Hiroshi Uehara, Saitama (JP); Mitoshi Umeki, Saitama (JP); Seiji Oda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 343 days.

(21) Appl. No.: 11/225,292

(22) Filed: Sep. 13, 2005

(65) Prior Publication Data

US 2006/0055479 A1   Mar. 16, 2006

(30) Foreign Application Priority Data

Sep. 14, 2004  (JP) ............................. 2004-267549
Oct. 1, 2004   (JP) ............................. 2004-290783

(51) Int. Cl.
  *H03H 9/02*   (2006.01)
  *H03B 5/32*   (2006.01)
  *H01L 41/09*  (2006.01)
(52) U.S. Cl. ...................... 310/348; 331/158
(58) Field of Classification Search ........ 310/348; 331/158
See application file for complete search history.

(56) References Cited

FOREIGN PATENT DOCUMENTS

| JP | 11-145728 | 5/1999 |
|----|-----------|--------|
| JP | 2000-196360 | 7/2000 |
| JP | 2001-028516 | 1/2001 |
| JP | 2004-040693 | 2/2004 |
| JP | 2004128528 A * | 4/2004 |
| JP | 2005311769 A * | 11/2005 |

* cited by examiner

*Primary Examiner*—J. San Martin
(74) *Attorney, Agent, or Firm*—Knobbe Martens Olson & Bear LLP

(57) ABSTRACT

In a crystal oscillator having a crystal blank, and an IC chip having integrated therein an oscillation circuit, the crystal blank has a first excitation electrode disposed on its first principal surface, and an extension electrode extended from the first excitation electrode to a peripheral region of the crystal blank, and folded back to the second principal surface. A first and a second crystal connection terminal are disposed on a first principal surface of the IC chip, and the second crystal connection terminal extends to a central region on the first principal surface of the IC chip to constitute a second excitation electrode. The extension electrode is secured to the first crystal connection terminal through a bump, such that the second principal surface of the crystal blank opposes the first principal surface of the IC chip, thereby holding the crystal blank in parallel with the first principal surface of the IC chip. The crystal blank is excited by the first and the second excitation electrodes.

19 Claims, 6 Drawing Sheets

SURFACE MOUNT CRYSTAL OSCILLATOR

BACKGROUND OF THE INVENTION

1. Field of the Invention

The present invention relates to a crystal oscillator of a surface mount type, and more particularly, to a miniature surface mount crystal oscillator which has a crystal blank mounted on an IC (integrated circuit) chip.

2. Description of the Related Art

A crystal oscillator which includes a quartz crystal unit and an oscillation circuit using the crystal unit integrated therein is used as a reference source for the frequency and time in a variety of devices. Particularly, surface mount crystal oscillators are contained in portable electronic devices as a reference source for the frequency and time because of its small size and light weight. In recent years, the oscillation frequency of surface mount crystal oscillators is made increasingly higher, driven by ever widespreading optical communications systems as well, to reach even into a 600 MHz band.

A further reduction in size as well as a higher oscillation frequency have been required for surface mount crystal oscillators. Generally, a surface mount crystal oscillator comprises a crystal blank as a crystal unit, and an IC chip which has integrated therein an oscillation circuit that uses the crystal unit, and these components are encapsulated in a surface mount package. Each of Japanese Patent Laid-open application No. 11-145728 (JP, 11-145728A), Japanese Patent Laid-open application No. 2000-196360 (JP, P2000-196360A) and Japanese Patent Laid-open application No. 2001-28516 (JP, P2001-28516A) each discloses a reduction in size of a surface mount crystal oscillator by mounting a crystal blank on an IC chip, particularly, a reduction in planar dimensions on a wiring board on which the crystal oscillator is mounted.

FIG. 1 illustrates a conventional surface mount crystal oscillator which has a crystal unit on an IC chip.

The crystal oscillator illustrated in FIG. 1 comprises package body 3 having a recess formed on one surface thereof; IC chip 1 and crystal blank 2 accommodated in the recess; and cover 4 which is put on the package body 1 to hermetically encapsulate IC chip 1 and crystal blank 2 in package body 3. Here, crystal blank 2 is mounted on IC chip 1. IC chip 1 has an oscillation circuit, not shown, using crystal blank 2, and the like integrated therein, and is fabricated by a normal semiconductor device manufacturing process. In IC chip 1, circuits such as the oscillation circuit are disposed on a surface of a semiconductor substrate, which constitutes IC chip 1, on the upper side as viewed in the figure. Therefore, out of both principal surfaces of IC chip 1, the surface of the semiconductor substrate formed with the oscillation circuit and the like is called the "circuit forming surface."

As illustrated in FIG. 2, a plurality of IC terminals 5 are formed to oppose each other, including a power supply terminal, a ground terminal, and an output terminal, along the periphery of the circuit forming surface of IC chip 1. Further, a pair of crystal connection terminals 5a, 5b are disposed at positions near the center of the circuit forming surface for electrically connecting crystal blank 2 to the oscillation circuit. The circuit forming surface of IC chip 1 is formed with an oxide film (i.e., insulating layer), not shown, made, for example, of $SiO_2$ on which IC terminals 5 and crystal connecting terminals 5a, 5b are formed using Al (aluminum), Au (gold) or the like.

Crystal blank 2, which is an AT-cut quartz crystal blank, by way of example, is generally formed in a rectangular shape as illustrated in FIG. 3. In the crystal oscillator described herein, crystal blank 2 has a plane geometry smaller than the geometry of IC chip 1, so that IC terminals 5 are not covered with crystal blank 2.

Excitation electrodes 6a, 6b are disposed on both principal surfaces of crystal blank 2, respectively. From these excitation electrodes 6a, 6b, extension electrodes 7a, 7b extend to positions near opposite corners of one shorter side of crystal blank 2. Each extension electrode 7a, 7b is folded back to the opposite principal surface on one edge portion of crystal blank 2. Then, these extension electrodes 7a, 7b are secured to crystal connection terminals 5a, 5b, respectively, disposed on the circuit forming surface of IC chip 1 for electrical and mechanical connection therebetween by ultrasonic thermo-compression bonding using bumps 8 made of Au or the like, or by thermo-compression bonding using an eutectic alloy. In this way, crystal blank 2 is held above IC chip 1 to be in parallel with the circuit forming surface of IC chip 1. As the eutectic alloy used in the thermo-compression bonding, a gold-germanium (AuGe) alloy is used, by way of example.

Package body 3, which is made, for example, of laminate ceramics, is formed with a step in the inner wall of the recess. Mounting electrodes 10 are disposed on the outer surface of package body 3 for use in mounting the crystal oscillator on a wiring board. Circuit terminals 9 are disposed on the top surface of the step in the recess so as to correspond to IC terminals 5 of IC chip 1, respectively, and these circuit terminals 9 are electrically connected to mounting electrodes 10, respectively, through a lamination plane of the laminate ceramics. IC chip 1 has the surface opposite to the circuit forming surface, secured to the bottom of the recess in package body 3. Then, IC terminals 5 on the circuit forming surface are electrically connected to circuit terminals 9 by wire bonding using gold wires 11 or the like. In this way, mounting terminals 10 on the outer surface of package body 1 are electrically connected to the ground terminal, power supply terminal, and output terminal of IC chip 1.

Such a surface mount crystal oscillator can be reduced in height and plane geometry because crystal blank 2 smaller than IC chip 1 is directly secured onto IC chip 1 for integration. Also, since crystal blank 2 is secured to IC chip 1 using a metal without using an organic conductive adhesive, the resulting crystal oscillator is not affected by a gas generated from the conductive adhesive, and therefore exhibits good aging characteristics.

FIG. 4 illustrates a conventional surface mount crystal oscillator which is further reduced in size. In the crystal oscillator illustrated in FIG. 4, an IC chip is electrically connected to a package body by ultrasonic thermo-compression bonding using bumps, instead of wire bonding. This crystal oscillator employs surface mount package body 3A which has a recess, and IC chip 1A having an integrated oscillation circuit and the like is disposed in the recess such that its circuit forming surface opposes the bottom of the recess in package body 3A. Crystal blank 2 is disposed on the back side of IC chip 1A, i.e., on the principal surface which is not the circuit forming surface. Then, the recess is covered with cover 4 to hermetically encapsulate IC chip 1A and crystal blank 2 within package body 3.

As illustrated in FIG. 5, a plurality of IC terminals 5 are formed, including a power supply terminal, ground terminal, and output terminal connected to an oscillation circuit, along the periphery of the circuit forming surface of IC chip 1A in a manner similar to the foregoing. A plurality of circuit terminal 9 are disposed, respectively, corresponding to IC terminals 5, on the bottom of the recess in package body 3A, and IC terminals 5 are secured to circuit terminals 9 for electrical connection by ultrasonic thermo-compression bonding using bumps made of Au (gold) or the like.

Package body 3A, which is made, for example, of laminate ceramics, is not formed with a step in the recess. Mounting electrodes 10 are disposed on the outer surface of package body 3A in a manner similar to the foregoing, such that mounting electrodes 10 are electrically connected to circuit terminals 9 through a lamination plane of the laminate ceramics.

A pair of crystal connection terminals 5a, 5b are disposed on the back side of IC chip 1A for connection to crystal blank 2, as illustrated in FIG. 6. A pair of auxiliary terminals 15a, 15b are formed on the circuit forming surface, corresponding to crystal connection terminals 5a, 5b. Crystal connection terminals 5a, 5b are electrically connected to auxiliary terminals 15a, 15b by through-holes (electrode through-holes) 16 which extend through IC chip 1A. Since auxiliary terminals 15a, 15b are electrically connected to the oscillation circuit on the circuit forming surface, crystal connection terminals 5a, 5b are also electrically connected to the oscillation circuit. The back side of IC chip 1A is formed with an oxide film (i.e., insulating layer), not shown, made, for example, of $SiO_2$, and crystal connection terminals 5a, 5b are formed on the oxide film by Al (aluminum), Au (gold) or the like.

As crystal blank 2, one similar to that illustrated in FIG. 3 can be used. Then, crystal blank 2 has its extension electrodes 7a, 7b secured to crystal connection terminals 5a, 5b for electrical and mechanical connection therebetween, for example, by thermo-compression bonding using an eutectic alloy such as AuGe or by ultrasonic thermo-compression bonding using bumps made of Au or the like, such that crystal blank 2 is held above IC chip 1A so as to be in parallel with the back side of IC chip 1A.

Since the surface mount crystal oscillator illustrated in FIG. 4 does not require a space for wire bonding and has crystal blank 2 directly secured onto IC chip 1A for integration, the surface mount crystal oscillator can be further reduced in height and plane geometry. Since no conductive adhesive is used, the resulting crystal oscillator is not affected by a gas generated from the conductive adhesive and therefore exhibits good aging characteristics.

In recent years, crystal oscillators have been required to have higher oscillation frequencies. With an AT-cut quartz crystal blank, its resonance frequency is inversely proportional to its thickness. For example, an AT-cut crystal blank having a resonance frequency of 100 MHz has a thickness of approximately 16.7 μm in a vibration region. A crystal blank in a 622-MHz band for use as optical communications has a thickness of approximately 2.2 μm in a vibration region. Thus, one of principal surfaces of crystal blank 2 is formed with depressed portion 11 by etching or the like to define vibration region 2A therein, as illustrated in FIG. 7, in order to increase the resonance frequency while maintaining the mechanical strength of the crystal blank. In this crystal blank, the resonance frequency is increased by reducing the thickness of the crystal blank in the depressed portion, i.e., vibration region, and the mechanical strength is maintained by holding vibration region 2A by relatively thicker portion 2B around the depressed portion. Further, Japanese Patent Laid-open application No. 2004-40693 (JP, P2004-40693A) discloses a crystal unit having a high vibration frequency which includes a first crystal plate having a through-hole and a second crystal plate having a flat shape adhered to each other by direct bonding, where a vibration region is defined at the position of the through-hole of the first crystal plate.

In the surface mount crystal oscillators illustrated in FIGS. 1 and 4, the crystal blank is secured to the IC chip using bumps, eutectic alloy or the like on both sides on one edge of the crystal blank from which the extension electrodes extend, i.e., at two positions in a peripheral region. Since the bumps and eutectic alloy are made of metal and fairly hard, a stress acts between the two positions in the peripheral region, for example, due to a difference in coefficient of thermal expansion between the IC chip and the crystal blank to distort the crystal blank. The oscillation characteristics of the crystal blank exacerbate due to such a stress applied thereto. Particularly, the problem of the exacerbated oscillation characteristics due to the applied stress is prominent in high-frequency crystal oscillators because such crystal oscillators employ a crystal blank having a smaller thickness.

SUMMARY OF THE INVENTION

It is an object of the present invention to provide a surface mount crystal oscillator which has an IC chip and a crystal blank integrated therein, suppresses the occurrence of a stress on the crystal blank to maintain good oscillation characteristics, and facilitates a reduction in size.

The object of the present invention is achieved by a crystal oscillator having a crystal blank, and an IC chip having integrated therein an oscillation circuit which uses the crystal blank, wherein the crystal blank comprises a first excitation electrode disposed on a first principal surface of the crystal blank; and an extension electrode extended from the first excitation electrode to a peripheral region of the crystal blank, and folded back to a second principal surface of the crystal blank at a position in the peripheral region, the IC chip has a first and a second crystal connection terminal disposed on a first principal surface of the IC chip, the second crystal connection terminal extends to a central region on the first principal surface of the IC chip to constitute a second excitation electrode, the extension electrode is secured to the first crystal connection terminal for electrical and mechanical connection therebetween by a conductive material which is an inorganic material, such that the second principal surface of the crystal blank opposes the first principal surface of the IC chip, thereby holding the crystal blank in parallel with the first principal surface of the IC chip, and the first excitation electrode and the second excitation electrode oppose across the crystal blank.

In the configuration as described above, the crystal blank can be excited by the first excitation electrode disposed on the first principal surface of the crystal blank and the second excitation electrode disposed on the IC chip, using the space field method on the second principal surface of the crystal blank. Then, since the IC chip is bonded to the crystal blank directly, the resulting surface-mount crystal oscillator is reduced in size. Also, the crystal blank is secured to the IC chip only at one point in its peripheral region, thus suppressing a distortion in the crystal blank caused by a difference in coefficient of thermal expansion between the IC chip and the crystal blank, as compared with a crystal blank secured at two points in a periphery region.

In the present invention, a depressed portion may be formed in the first principal surface of the crystal blank, such that the crystal blank is reduced in thickness in the area of this depressed portion, and this area serves as a vibration region. A first excitation electrode may be formed on the bottom of the depressed portion, and an extension electrode may extend to a relatively thick region around the depressed portion to be secured to the first crystal connection terminal. Such a configuration results in a surface mount crystal oscillator which provides high oscillation frequencies. In this event, a first crystal plate having a through-hole is directly bonded to a second crystal plate having a flat shape to constitute a crystal blank, thereby making the thickness uniform in the vibration region of the crystal blank to exhibit better oscillation characteristics. Further, a cavity having a depth smaller than the depressed portion is formed in the second principal surface of the crystal blank corresponding to the position of the depressed portion, thereby ensuring that a gap is maintained between the vibration region of the crystal blank and the first principal surface of the IC chip to eliminate impediments to oscillation due to the first principal surface of the IC chip coming in contact with the vibration region.

In the present invention, as a conductive material made of an inorganic material, a metal, for example, can be used. Specifically, the extension electrode can be secured to the crystal connection terminal by ultrasonic thermo-compression bonding using a gold bump, or thermo-compression bonding using an eutectic alloy.

DETAILED DESCRIPTION OF THE PREFERRED EMBODIMENTS

Figure 8:
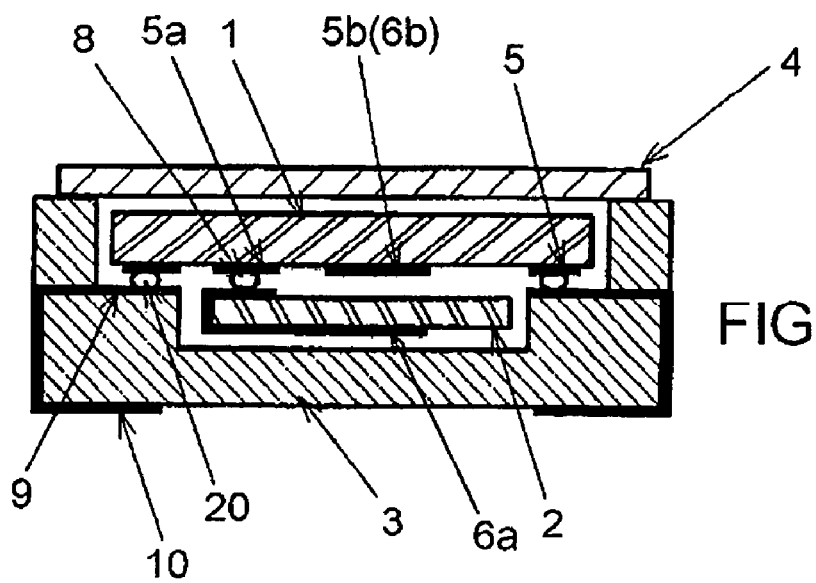
FIG. 8 is a cross-sectional view illustrating the configuration of a surface mount crystal oscillator according to a first embodiment of the present invention.

FIG. 8 illustrates a surface mount crystal oscillator according to a first embodiment of the present invention. In the following description, components identical to those in FIGS. 1 to 7 are designated the same reference numerals, and repetitive descriptions thereon will be simplified.

Figure 1:
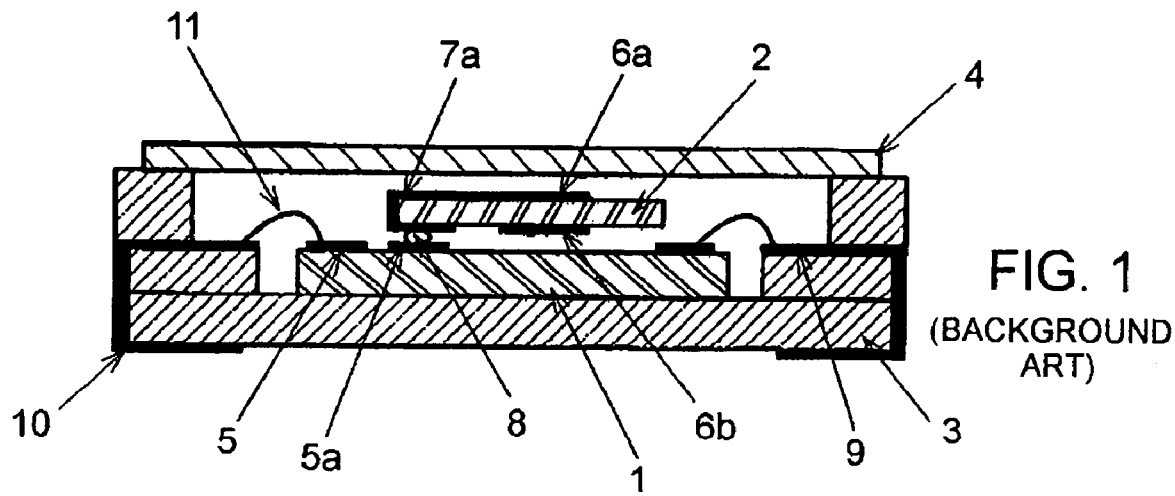
FIG. 1 is a cross-sectional view illustrating the configuration of a conventional surface mount crystal oscillator.
Figure 2:
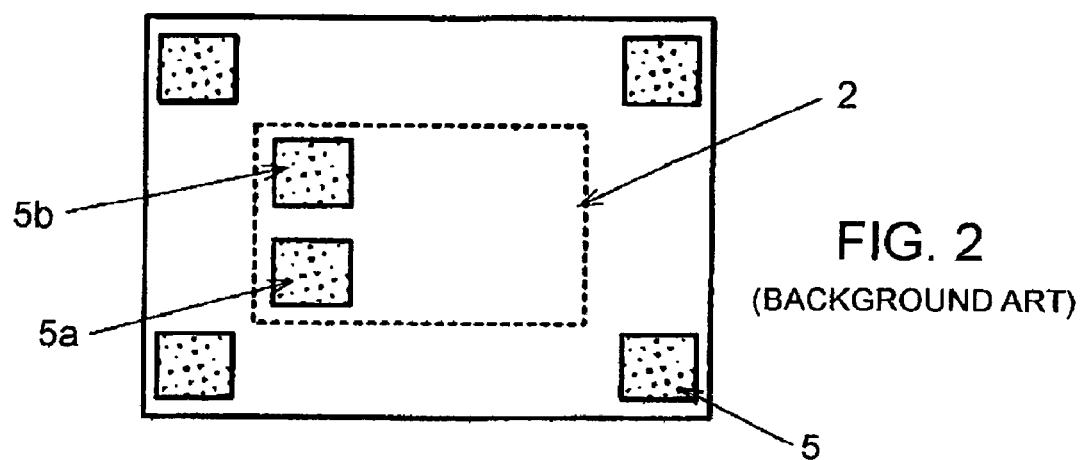
FIG. 2 is a plan view illustrating a circuit forming surface of an IC chip used in the crystal oscillator illustrated in FIG. 1.
Figure 3:
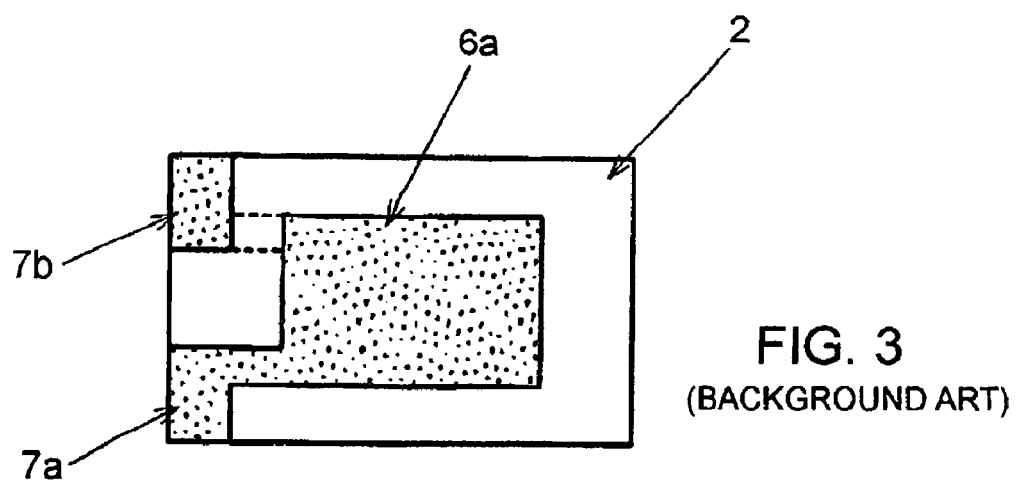
FIG. 3 is a plan view illustrating a crystal blank.

The surface mount crystal oscillator of the first embodiment comprises surface mount package body 3 similar to the package body in the crystal oscillator illustrated in FIG. 1; IC chip 1 and crystal blank 2 integrated and contained in a recess of package body 3; and a cover 4 put on package body 3 to hermetically encapsulate IC chip 1 and crystal blank 2.

Figure 9:
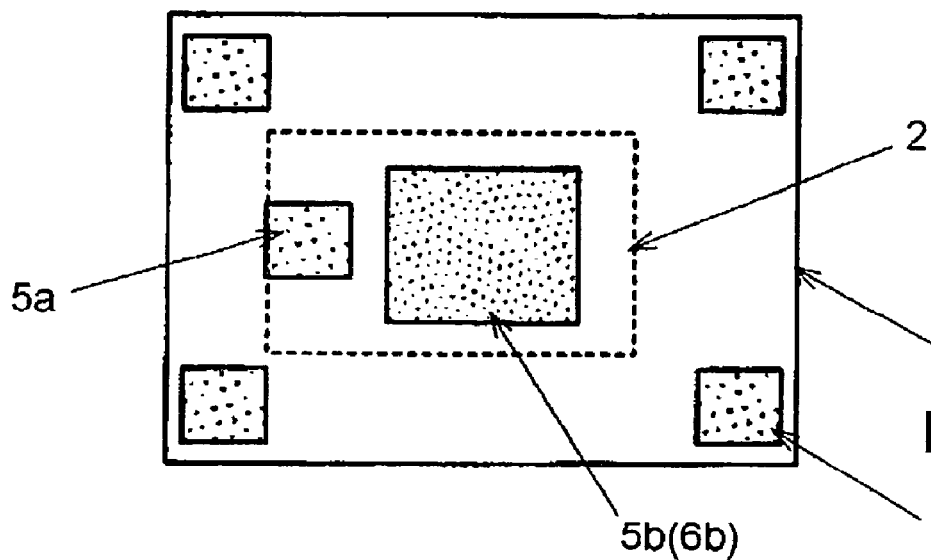
FIG. 9 is a plan view illustrating a circuit forming surface of an IC chip used in the crystal oscillator illustrated in FIG. 8.

IC chip 1 has an oscillation circuit, which uses crystal blank 2, and the like integrated therein. On a circuit forming surface of IC chip 1 formed with circuits such as the oscillation circuit, a plurality of IC terminals 5, including a power supply terminal, a ground terminal, and an output terminal, are disposed at four corners of the circuit forming surface along the periphery for connection to the oscillation circuit, as illustrated in FIG. 9.

Further, crystal connection terminals 5a, 5b are disposed on the circuit forming surface for electrically connecting crystal blank 2 to the oscillation circuit. In this crystal oscillator, crystal blank 2 is secured to the circuit forming surface of IC chip 1, and a broken line in FIG. 9 corresponds the position of the periphery of crystal blank 2 secured on the circuit forming surface. One crystal connection terminal 5a is formed at a position corresponding to the periphery of crystal blank 2, while the other crystal connection terminal 5b, which has a relatively large area, is formed in a central region of the circuit forming surface. As will be later described, crystal connection terminal 5b will later serve as excitation electrode 6b when crystal blank 2 is excited by a space field method. IC terminals 5 and crystal connection terminals 5a, 5b are formed of Al (aluminum), Au (gold) or the like on an oxide film (i.e., insulating layer), not shown, formed on the circuit forming surface.

Crystal blank 2, which is an AT-cut quartz crystal blank substantially in a rectangular shape, comprises excitation electrode 6a in a central region of one principal surface, and extension electrode 7 extends from excitation electrode 6a toward the center of one shorter side of crystal blank 2. Extension electrode 7 is formed to be folded back to the opposite principal surface at a position of the periphery of crystal blank 2. Extension electrode 7 is secured to crystal connection terminal 5a for electrical and mechanical connection therebetween, for example, by ultrasonic thermo-compression bonding using bump 8, or by thermo-compression bonding using an eutectic alloy, not shown, such that the principal surface not formed with excitation electrode 6a of crystal blank 2 opposes the circuit forming surface of IC chip 1. In this way, crystal blank 2 is secured to IC chip 1, and held horizontally to the circuit forming surface. In this structure, excitation electrodes 6a, 6b oppose each other across the crystal blank.

Package body 3 has a recess formed with a step in a manner similar to that illustrated in FIG. 1, and the step is formed with circuit terminals 9 electrically connected to mounting electrodes 10 on the outer surface of package body 3. A space surrounded by the step and the bottom in the recess of package body 3 is formed larger than crystal blank 2 so that crystal blank 2 can be accommodated therein. Then, IC terminals 5 of IC chip 1 are secured to circuit terminals 9 for electrical and mechanical connection therebetween by ultrasonic thermo-compression bonding using bumps 20, with the circuit forming surface facing the bottom of the recess, to fix IC chip 1 to package body 3. In this event, crystal blank 2 secured to IC chip 1 is fitted in the space surrounded by the step and bottom of the recess.

In the foregoing configuration, crystal blank 2 can be applied with a high-frequency electric field by excitation electrode 6a disposed on one principal surface of crystal blank 2 and excitation electrode 6b disposed on the circuit forming surface of IC chip 1 to excite crystal blank 2. In other words, crystal blank 2 can be excited employing the space field method on the other principal surface of crystal blank 2. Particularly, this configuration can prevent an oscillation loss in crystal blank 2 due to a mass load when the oscillation frequency is high, because crystal blank 2 is provided with the excitation electrode only on one principal surface thereof. A gap can be maintained between the circuit forming surface of IC chip 1 and crystal blank 2 at an appropriate value by controlling the total thickness of one crystal connection terminal 5a and bump 8 or by providing a spacer, not shown.

Also, in this surface mount crystal oscillator, crystal blank 2 is secured to IC chip 1 only at one point on the periphery thereof, thus suppressing a distortion in crystal blank 2 caused by a difference in coefficient of thermal expansion between IC chip 1 and crystal blank 2, as compared with crystal blank secured at two points on the periphery. Since both IC chip 1 and crystal blank 2 are secured by thermocompression bonding using a metal which is basically an inorganic material, no organic gas will be produced within the recess of package body 3. Consequently, this surface mount crystal oscillator maintains the good oscillation characteristics, including the aging characteristics.

Also, since IC terminals 5 of IC chip 1 are directly connected to circuit terminals 9 formed in the recess of package body 3 by bumps or the like, this surface mount crystal oscillator does not require a space for wire bonding, as compared with the one illustrated in FIG. 1, and can therefore realize a further reduction in size.

Figure 11:
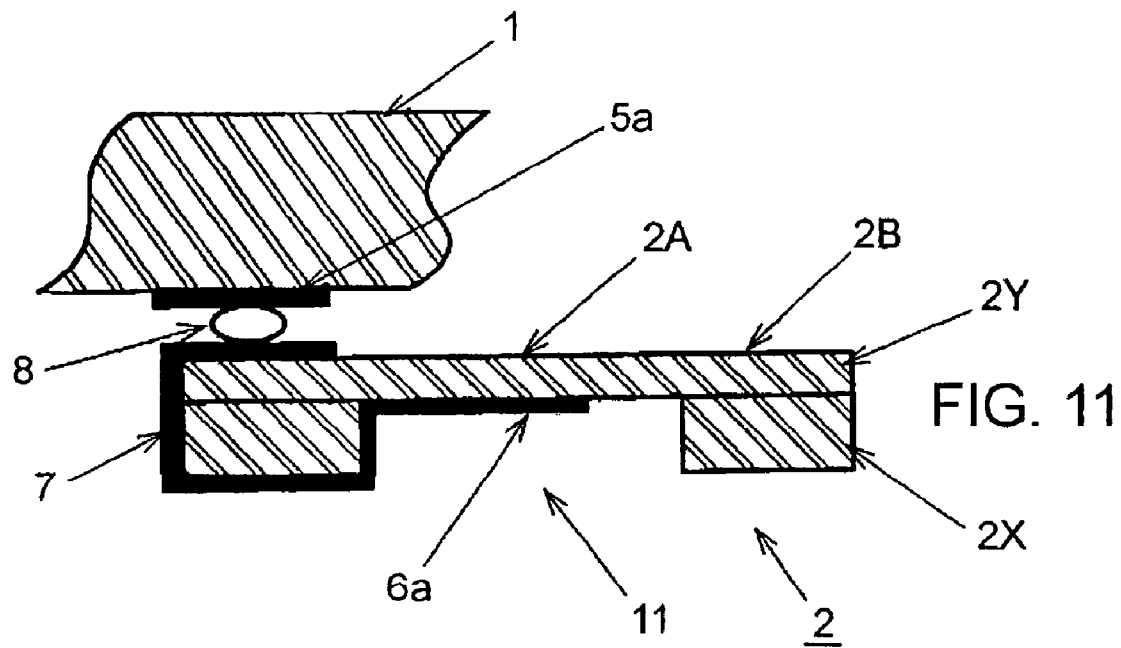
FIG. 11 is a partial cross-sectional view illustrating another example of a crystal blank used in the crystal oscillator illustrated in FIG. 8.

This embodiment can also employ a crystal blank which is reduced in thickness in the vibration region to support high oscillation frequencies. In this event, as illustrated in FIG. 11, crystal blank 2 has depressed portion 11 on one principal surface, as is the case with the one illustrated in FIG. 7, and is therefore reduced in thickness across depressed portion 11 to form vibration region 2A. The portion surrounding depressed region 11 is relatively thick perimeter region 2B. Since crystal blank 2 is excited by the space field method, crystal blank 2 is secured to IC chip 1 such that the side of crystal blank 2, not formed with depress portion 11, opposes IC chip 1. Excitation electrode 6a on crystal blank 2 is formed on the bottom of depressed portion 11. In the embodiment illustrated in FIG. 11, first crystal plate 2X having a through-hole and second crystal plate 2Y of a flat planar shape are bonded, for example, by direct bonding based on siloxane bond to form crystal blank 2. When two crystal plates 2X, 2Y are bonded to form crystal blank 2, second crystal plate 2 can be minimized in thickness, so that the flatness of the crystal blank can be improved in vibration region 2A, as compared with depressed portion 11 formed by etching.

Figure 12:
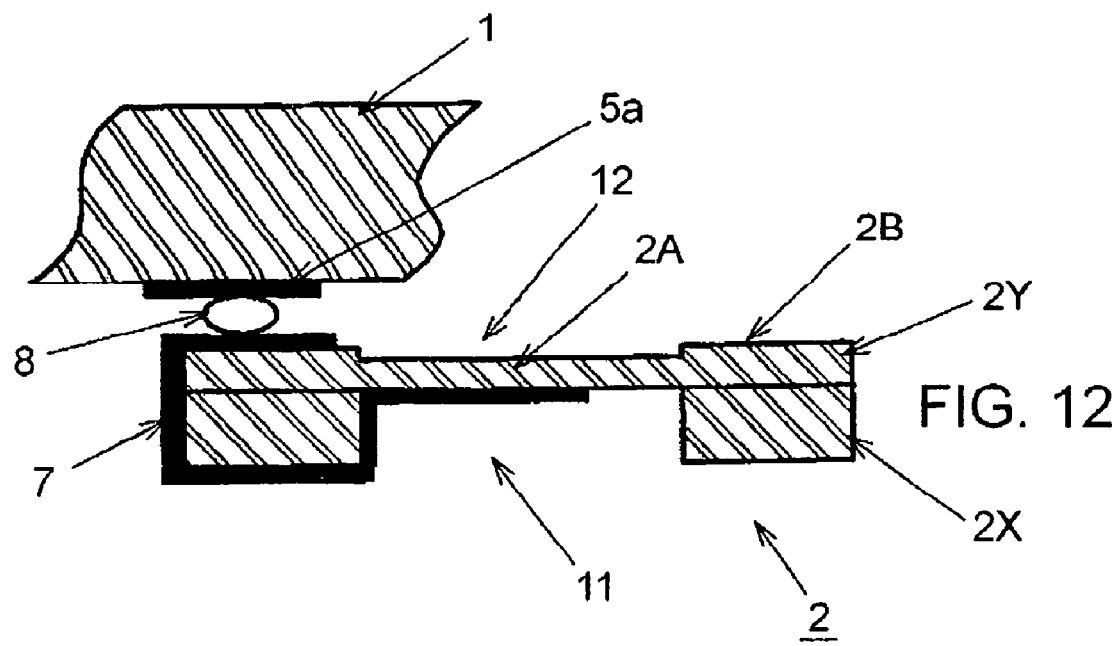
FIG. 12 is a partial cross-sectional view illustrating a further example of a crystal blank used in the crystal oscillator illustrated in FIG. 8.

Further, as illustrated in FIG. 12, cavity 12 having a smaller depth than depressed region 11 may be formed on the other principal surface of crystal blank 2, i.e., the surface of second crystal plate 2Y to ensure that a gap is maintained between the circuit forming surface of IC chip 1 and vibration region 2A, thereby preventing impediments to thickness-shear vibration of the crystal blank in vibration region 2A. While FIG. 12 shows excitation electrode 6a and extension electrode 7 to have large thicknesses for sake of convenience, the depth of cavity 12 is on the order of micrometers, and is larger than the thickness of excitation electrode 6a which is formed in the order of angstroms.

In the embodiments illustrated in FIGS. 11 and 12, crystal blank 2 is provided with depressed portion 11 which is used as vibration region 2A, so that this is particularly suitable for surface mount crystal oscillator for generating high frequencies of 100 MHz or higher. The crystal blanks illustrated in FIGS. 11 and 12 are each produced by bonding a second crystal wafer corresponding to second crystal plate 2Y to a first crystal wafer formed with a plurality of through-holes and corresponding to first crystal plate 2X, and then dividing into individual crystal blanks, as described in JP, P2004-40693A.

Figure 13:
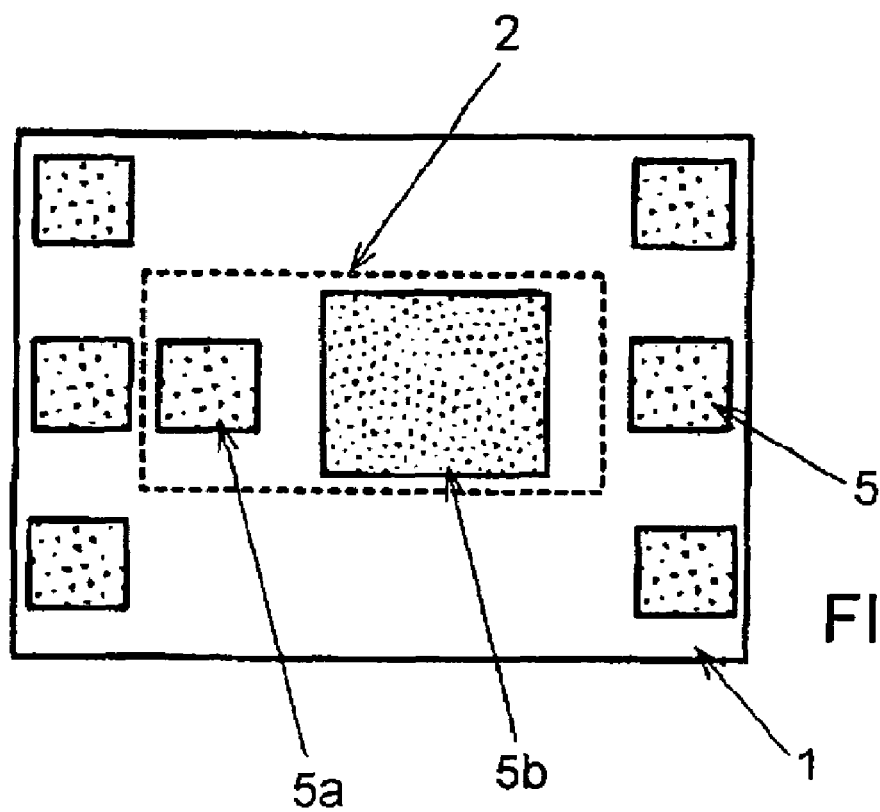
FIG. 13 is a plan view illustrating another exemplary layout on the circuit forming surface.
Figure 14:
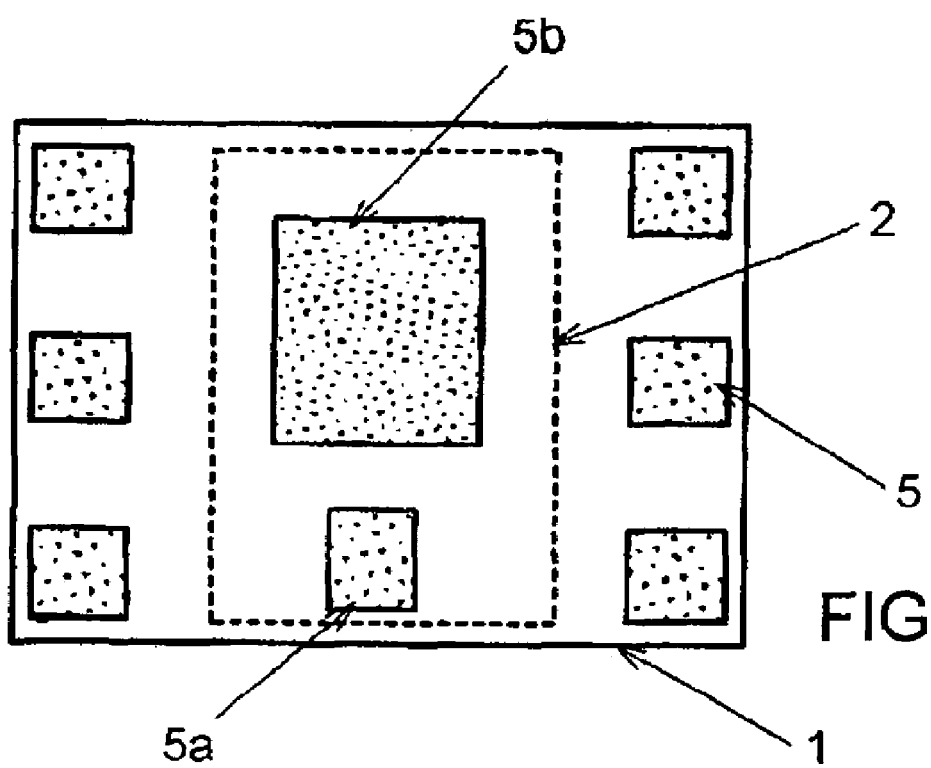
FIG. 14 is a plan view illustrating a further exemplary layout on the circuit forming surface.

In the surface mount crystal oscillator of the first embodiment, the layout of IC terminals 5 and crystal connection terminals 5a, 5b on the circuit forming surface of IC chip 1 is not limited to that illustrated in FIG. 9. For example, when six IC terminals 5 are provided, three IC terminals 5 may be uniformly disposed on each of a pair of opposing sides of the circuit forming surface. In this event, crystal connection terminals 5a, 5b may be disposed such that the longitudinal direction of crystal blank 2 is parallel with the longitudinal direction of the circuit forming surface as illustrated in FIG. 13, or crystal connection terminals 5a, 5b may be disposed such that the longitudinal direction of crystal blank 2 is perpendicular to the longitudinal direction of the circuit forming surface, as illustrated in FIG. 14. When the number of IC terminals 5 is further increased, IC terminals 5 may be disposed on all of four sides of the circuit forming surface. The layout of IC terminals 5 and crystal connection terminals 5a, 5b can be arbitrarily determined as long as it satisfies the condition that crystal blank 2 is fitted in the space surrounded by the step and bottom of the recess of package body 3 from the relationship between IC chip 1 and crystal blank 2.

Figure 15:
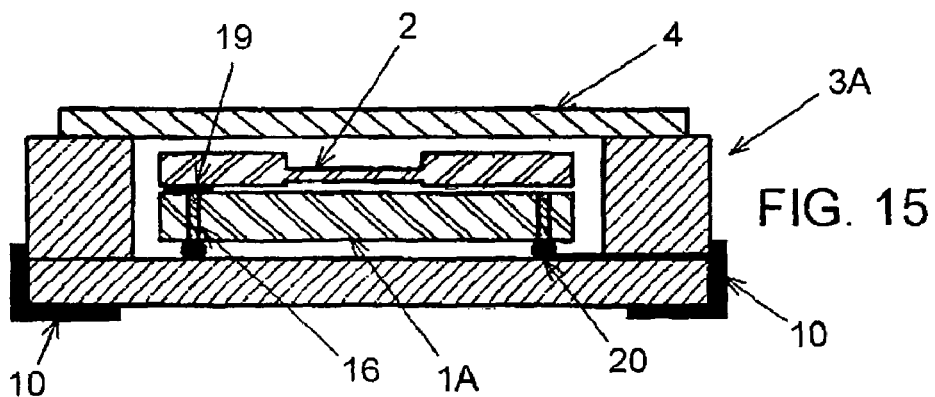
FIG. 15 is a cross-sectional view illustrating the configuration of a surface mount crystal oscillator according to a second embodiment of the present invention.
Figure 16:
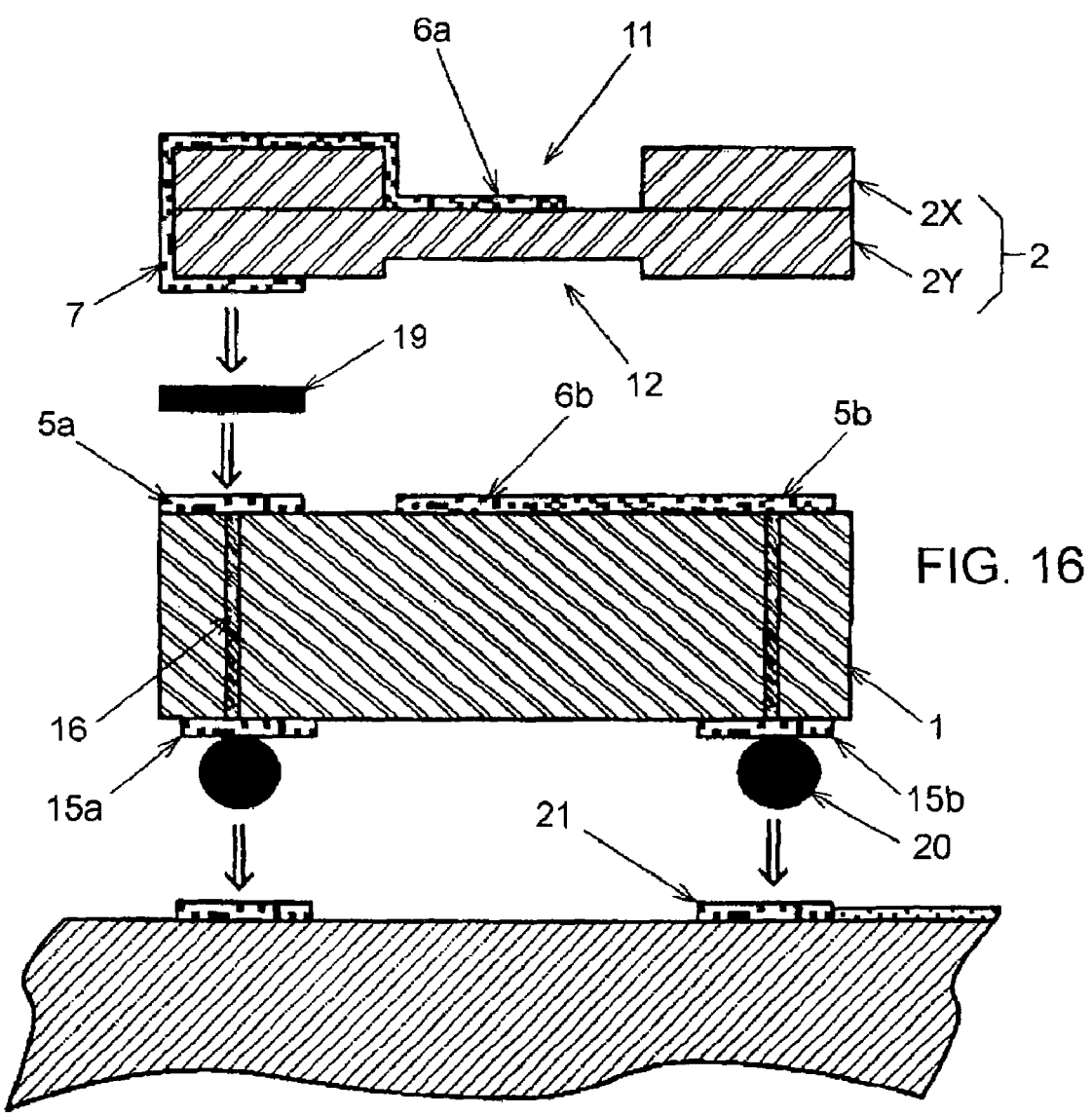
FIG. 16 is an exploded cross-sectional view showing how to assemble the surface mount crystal oscillator illustrated in FIG. 15.

Next, a description will be given of a surface mount crystal oscillator according to a second embodiment of the present invention. The surface mount crystal oscillator of the second embodiment illustrated in FIG. 15 comprises surface mount package body 3A similar to the package body in the crystal oscillator illustrated in FIG. 4; IC chip 1A and crystal blank 2 integrated and contained in a recess of package body 3A; and cover 4 put on package body 3A to hermetically encapsulate IC chip 1A and crystal blank 2. IC chip 1A has an oscillation circuit using crystal blank 2, and the like integrated therein. In the crystal oscillator of the first embodiment, the crystal blank is secured to the circuit forming surface of the IC chip, whereas in the crystal oscillator of the second embodiment, crystal blank 2 is secured to the back side of IC chip 1A, i.e., the principal surface which is not the circuit forming surface. FIG. 15 is an exploded cross-sectional view showing how to assemble the configuration of a main portion in the crystal oscillator according to the second embodiment.

Figure 10:
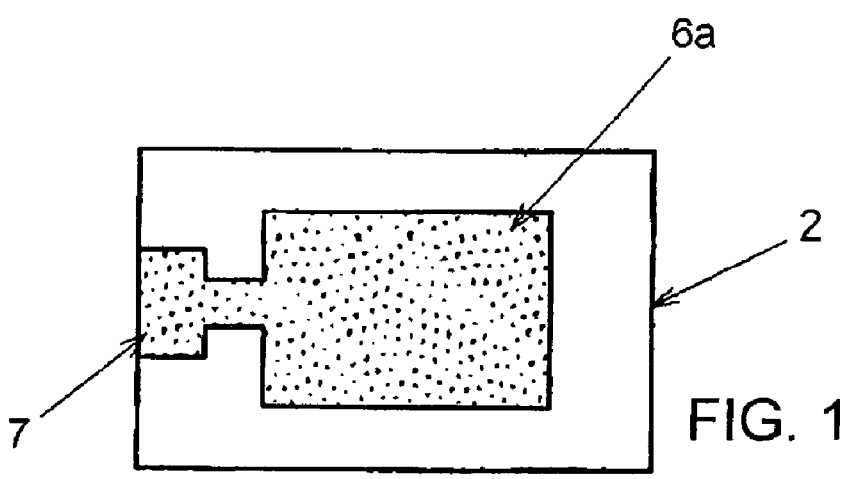
FIG. 10 is a plan view of a crystal blank used in the crystal oscillator illustrated in FIG. 8.

While crystal blank 2 illustrated in FIG. 10 or FIG. 11 may be used herein, assume that a crystal blank illustrated in FIG. 12 is used on the assumption that the surface mount crystal oscillator has oscillation outputs at high frequencies exceeding, for example, 100 MHz. Specifically, in this crystal blank 2, one principal surface is formed with depressed portion 11 and is therefore reduced in thickness in the area of depressed portion 11 to form a vibration region. Around the oscillation area, there is a thicker perimeter region. This crystal blank is formed by adhering second crystal plate 2Y having a thickness corresponding to the vibration region to first crystal plate 2X having a through-hole corresponding to depressed portion 11 by direct bonding based on siloxane bond. The other principal surface of crystal blank 2, i.e., the surface of second crystal plate 2Y, is formed with cavity 12, having a depth smaller than depressed portion 11, at a position corresponding to depressed portion 11. Excitation electrode 6a is formed on the bottom of depressed portion 11, and extension electrode extends from excitation electrode 6a toward the center of one shorter side of crystal blank 2. Extension electrode 7 is formed to be folded back to the other principal surface at a position on one edge of crystal blank 2.

Crystal connection terminals 5a, 5b are disposed on the back side of IC chip 1A, i.e., on the principal surface which is not the circuit forming surface. Crystal connection terminals 5a, 5b are electrically connected to auxiliary terminals 15a, 15b disposed on the circuit forming surface and electrically connected to the oscillation circuit through through-holes 16 which extend through IC chip 1A. While crystal connection terminals 5a, 5b are disposed at both end regions of the back side of crystal blank 2, crystal connection terminal 5b is provided to extend to a central region on the back side of IC chip 1A, and functions as excitation electrode 6b in the central region on the back side of IC chip 1A when crystal blank 2 is excited by the space field method, as will be later described. The size of excitation electrode 6b is chosen to be substantially the same as the size of excitation electrode 6a on crystal blank 2. Extension electrode 7 is secured to crystal connection terminal 5a for electrical and mechanical connection therebetween, for example, by thermo-compression bonding using eutectic alloy 19 such that the principal surface of crystal blank 2, not formed with excitation electrode 6a, opposes the back side of IC chip 1A. In this way, crystal blank 2 is secured to IC chip 1A, and is held horizontally to the back side of IC chip 1A. In this event, excitation electrodes 6a, 6b oppose across the crystal blank. Instead of the thermo-compression bonding using an eutectic alloy, extension electrode 7 may be secured to crystal connection terminal 5a by ultrasonic thermo-compression bonding using a bump.

Figure 4:
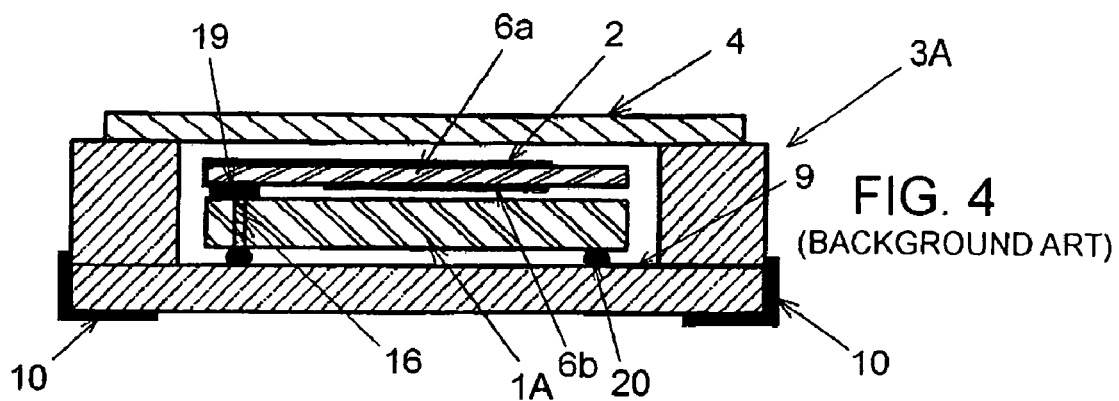
FIG. 4 is a cross-sectional view illustrating another exemplary configuration of a conventional surface mount crystal oscillator.
Figure 5:
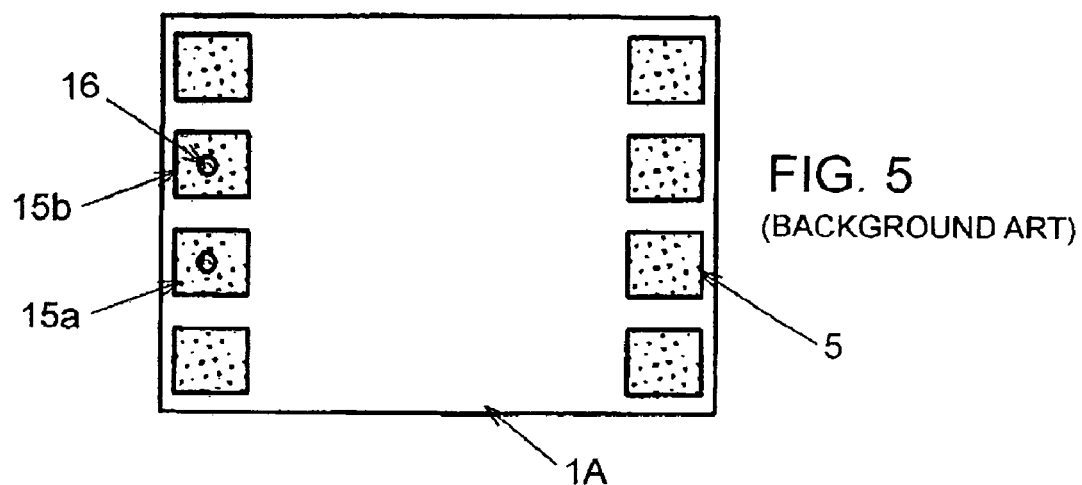
FIG. 5 is a plan view illustrating a circuit forming surface of an IC chip used in the crystal oscillator illustrated in FIG. 4.
Figure 6:
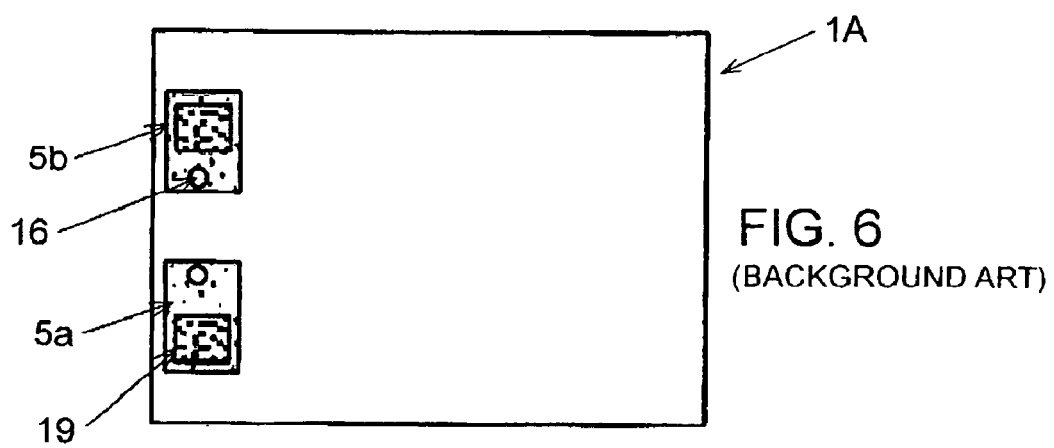
FIG. 6 is a plan view illustrating the opposite principal surface to the circuit forming surface of the IC chip used in the crystal oscillator illustrated in FIG. 4.
Figure 7:
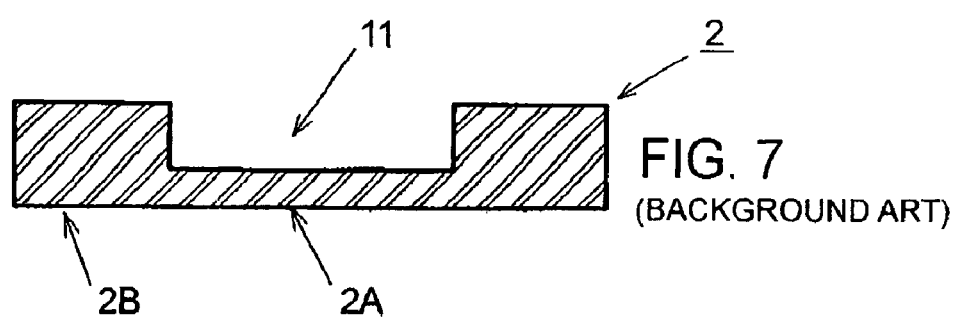
FIG. 7 is a cross-sectional view of a crystal blank.

IC terminals are disposed on the circuit forming surface of IC chip 1A in a manner similar to those illustrated in FIG. 5, and circuit terminals are disposed on the bottom of the recess in package body 3A in a manner similar to those illustrated in FIG. 4, so that after crystal blank 2 is secured to IC chip 1A, the IC terminals are secured to the circuit terminals for electrical and mechanical connection therebetween by ultrasonic thermo-compression bonding using bumps, such that the circuit forming surface of IC chip 1A faces the bottom of package body 3A, to secure IC chip 1A to package body 3A. In this event, circuit terminals 21 are formed on the bottom of package body 3A corresponding to the positions of auxiliary terminals 15a, 15b, and auxiliary terminals 15a, 15b are also secured to circuit terminals 21 by ultrasonic thermo-compression bonding using bumps 20.

Likewise, in the foregoing configuration, crystal blank 2 can be applied with a high-frequency electric field to excite the crystal blank by excitation electrode 6a disposed on one principal surface of crystal blank 2 and excitation electrode 6b disposed on the back side of IC chip 1A. In other words, the other principal surface of the crystal blank can be excited as the space field method. In this configuration, crystal blank 2 is also provided with the excitation electrode only on one principal surface thereof, thus making it possible to prevent an oscillation loss in crystal blank 2 due to a mass load when the oscillation frequency is high. The provision of cavity 12 ensures that a gap is maintained between the back side of IC chip 1 and the vibration region of crystal blank 2, thereby preventing impediments to thickness-shear vibration of the crystal blank in vibration region 2A.

In this surface mount crystal oscillator, crystal blank 2 is also secured to IC chip 1A only at one point in the peripheral region thereof, thus suppressing a distortion in crystal blank 2 caused by a difference in coefficient of thermal expansion between IC chip 1 and crystal blank 2. Since both IC chip 1 and crystal blank 2 are secured by thermo-compression bonding using a metal which is basically an inorganic material, no organic gas will be produced within the recess of package body 3. Consequently, this surface mount crystal oscillator also maintains the good oscillation characteristics, including the aging characteristics.

In the surface mount crystal oscillator of the second embodiment described above, cavity 12 is formed on the other principal surface of crystal blank 2 to ensure the spacing between the vibration region of crystal blank 2 and the back side of IC chip A. Alternatively, the total thickness of crystal connection terminal 5a and eutectic alloy 19 may be controlled, or crystal connection terminal 5a may be increased in thickness, or a spacer may be provided, instead of providing cavity 12. However, the spacing between the vibration region and IC chip 1A can be maintained with certainty when cavity 12 is provided.

What is claimed is:

1. A crystal oscillator having a crystal blank, and an IC chip having integrated therein an oscillation circuit which uses said crystal blank, wherein:

said crystal blank comprises a first excitation electrode disposed on a first principal surface of said crystal blank; and an extension electrode extended from said first excitation electrode to a peripheral region of said crystal blank, and folded back to a second principal surface of said crystal blank at a position in the peripheral region, said IC chip has a first and a second crystal connection terminal disposed on a first principal surface of said IC chip, said second crystal connection terminal extends to a central region on the first principal surface of said IC chip to constitute a second excitation electrode, said extension electrode is secured to said first crystal connection terminal for electrical and mechanical connection therebetween by a conductive material which is an inorganic material, such that the second principal surface of said crystal blank opposes the first principal surface of said IC chip, thereby holding said crystal blank in parallel with the first principal surface of said IC chip, and said first excitation electrode and said second excitation electrode oppose across said crystal blank.

2. The crystal oscillator according to claim 1, further comprising:

a package body having a recess for accommodating said crystal blank and said IC Chip; and a cover for hermetically encapsulating said crystal blank and said IC chip within said recess.

3. The crystal oscillator according to claim 2, wherein the first principal surface of said IC chip is a circuit forming surface of said IC chip, said circuit forming surface includes a plurality of IC terminals formed along a periphery thereof, and said recess of said package body includes a step formed with circuit terminals, wherein said IC chip is secured to said package body by securing said IC terminals to said circuit terminals using the conductive material with said circuit forming surface opposing the bottom of said recess, such that said crystal blank is fitted in a space surrounded by said step and the bottom of said recess.

4. The crystal oscillator according to claim 2, wherein the circuit forming surface of said IC chip is a second principal surface of said IC chip, and said IC chip has through-holes for electrically connecting said circuit forming surface to said first and second crystal connection terminals.

5. The crystal oscillator according to claim 4, comprising:
circuit terminals on the bottom of the recess in said package body; and
IC terminals on said circuit forming surface,
wherein said IC terminals are secured to said circuit terminals using the conductive material to secure said IC chip to said package body.

6. The crystal oscillator according to claim 5, wherein said IC terminals are secured to said circuit terminals by ultrasonic thermo-compression bonding using bumps.

7. The crystal oscillator according to claim 1, wherein:
said crystal blank is formed with a depressed portion in the first principal surface, so that said crystal blank is reduced in thickness in an area of the depressed portion, said area constituting a vibration region of said crystal blank, and
said first excitation electrode is formed on a bottom of said depressed portion, and said extension electrode extends to a relatively thick region around said depressed portion to be secured to said first crystal connection terminal.

8. The crystal oscillator according to claim 7, wherein said crystal blank is made by directly bonding a first crystal plate having a through-hole to a second crystal plate having a flat shape.

9. The crystal oscillator according to claim 7, wherein said crystal blank includes a cavity having a depth smaller than said depressed portion and formed in the second principal surface thereof, corresponding to the position of said depressed portion.

10. The crystal oscillator according to claim 1, wherein said conductive material is made of a metal.

11. A crystal oscillator comprising:
(I) a crystal blank comprising:
a first excitation electrode disposed on a first principal surface of the crystal blank; and
an extension electrode extended from the first excitation electrode to a peripheral region of the crystal blank, and folded back to a second principal surface of the crystal blank at a position in the peripheral region;
(II) an IC chip having an oscillation circuit integrated therein which circuit uses the crystal blank, said IC chip comprising:
a first crystal connection terminal disposed on a first principal surface of the IC chip, said first principal surface facing against the second principal surface of the crystal blank and holding the crystal blank in parallel thereto, wherein the extension electrode on the second principal surface of the crystal blank is secured to the first crystal connection terminal for electrical and mechanical connection therebetween by an inorganic conductive material; and
a second crystal connection terminal serving as a second excitation electrode which is disposed on the first principal surface of the IC chip and extends to a central region on the first principal surface, said second excitation electrode facing the second principal surface of the crystal blank and being opposed to the first excitation electrode via the crystal blank.

12. The crystal oscillator according to claim 11, further comprising:
a package body having a recess for accommodating the crystal blank and the IC chip; and
a cover for hermetically encapsulating the crystal blank and the IC chip within the recess.

13. The crystal oscillator according to claim 12, wherein the first principal surface of the IC chip is a circuit forming surface which includes a plurality of IC terminals formed along a periphery thereof, and the recess of the package body includes a step provided with circuit terminals, wherein the IC chip is secured to the package body by securing the IC terminals to the circuit terminals using an inorganic conductive material, and the crystal blank is fitted in a space surrounded by the step and a bottom of the recess.

14. The crystal oscillator according to claim 12, wherein the IC chip has a second principal surface opposite to the first principal surface, said second principal surface being a circuit forming surface, and the IC chip has through-holes for electrically connecting the circuit forming surface to the first and second crystal connection terminals.

15. The crystal oscillator according to claim 14, wherein the package body includes circuit terminals on a bottom of the recess, and the circuit forming surface includes IC terminals, wherein the IC terminals are secured to the circuit terminals using an inorganic conductive material to secure the IC chip to the package body.

16. The crystal oscillator according to claim 15, wherein the IC terminals are secured to the circuit terminals by ultrasonic thermo-compression bonding using bumps.

17. The crystal oscillator according to claim 11, wherein the crystal blank has a depressed portion having a reduced thickness in the first principal surface, which portion serves as a vibration region and has a bottom on which the first excitation electrode is formed, and a relatively thick region around the depressed portion on which the extension electrode is formed.

18. The crystal oscillator according to claim 17, wherein the crystal blank includes a cavity formed in the second principal surface at a position opposite to the depressed portion and having a depth smaller than that of the depressed portion.

19. The crystal oscillator according to claim 11, wherein the inorganic conductive material is constituted by a metal.

* * * * *

UNITED STATES PATENT AND TRADEMARK OFFICE
CERTIFICATE OF CORRECTION

PATENT NO.        : 7,339,309 B2                                      Page 1 of 1
APPLICATION NO.   : 11/225292
DATED             : March 4, 2008
INVENTOR(S)       : Masayoshi Okazaki et al.

It is certified that error appears in the above-identified patent and that said Letters Patent is hereby corrected as shown below:

Column 10, line 20; Delete "chip A" and insert -- chip 1A --, therefor.

Signed and Sealed this

Twenty-third Day of September, 2008

JON W. DUDAS
*Director of the United States Patent and Trademark Office*